(12) United States Patent
Lin

(10) Patent No.: US 12,394,720 B2
(45) Date of Patent: Aug. 19, 2025

(54) SEMICONDUCTOR PACKAGE INCLUDING REINFORCEMENT STRUCTURE AND METHODS OF FORMING THE SAME

(71) Applicant: Taiwan Semiconductor Manufacturing Company Limited, Hsinchu (TW)

(72) Inventor: Wei-Hung Lin, Xinfeng Township (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 531 days.

(21) Appl. No.: 17/888,529

(22) Filed: Aug. 16, 2022

(65) Prior Publication Data

US 2024/0063128 A1 Feb. 22, 2024

(51) Int. Cl.
*H01L 23/538* (2006.01)
*H01L 21/48* (2006.01)
(Continued)

(52) U.S. Cl.
CPC ...... *H01L 23/5383* (2013.01); *H01L 21/4857* (2013.01); *H01L 23/49894* (2013.01); *H01L 23/5385* (2013.01); *H01L 23/562* (2013.01); *H01L 24/13* (2013.01); *H01L 24/16* (2013.01); *H01L 24/29* (2013.01); *H01L 24/32* (2013.01); *H01L 24/73* (2013.01);
(Continued)

(58) Field of Classification Search
CPC .... H01L 23/5383; H01L 23/498; H01L 21/48
See application file for complete search history.

(56) References Cited

U.S. PATENT DOCUMENTS 11,063,169 B2 * 7/2021 Chen ................ H01L 21/30621
2010/0320594 A1 * 12/2010 Yamano ............... H01L 21/561
257/693
(Continued)

FOREIGN PATENT DOCUMENTS

CN 107887361 A 4/2018
JP 2004128364 A 4/2004
(Continued)

OTHER PUBLICATIONS

JP Patent and Trademark Office; JP Application No. 2023-101456; Decision to Grant mailed Jun. 25, 2024; 5 pages.
(Continued)

*Primary Examiner* — Dale E Page
*Assistant Examiner* — Wilner Jean Baptiste
(74) *Attorney, Agent, or Firm* — The Marbury Law Group, PLLC

(57) ABSTRACT

A semiconductor package includes a package substrate a package substrate including: a substrate core; an upper redistribution layer disposed on a first side of the substrate core; and a lower redistribution layer disposed on an opposing second side of the substrate core; a semiconductor device vertically stacked on and electrically connected to the package substrate; and an upper reinforcement layer embedded in the upper redistribution layer between the semiconductor device and the substrate core, the upper reinforcement layer having a Young's modulus that is higher than a Young's modulus of the upper redistribution layer.

20 Claims, 8 Drawing Sheets

(51) Int. Cl.
　　　*H01L 23/00*　　　(2006.01)
　　　*H01L 23/498*　　(2006.01)
(52) U.S. Cl.
　　　CPC ............... *H01L 2224/13147* (2013.01); *H01L 2224/13155* (2013.01); *H01L 2224/16227* (2013.01); *H01L 2224/2919* (2013.01); *H01L 2224/32221* (2013.01); *H01L 2224/73204* (2013.01); *H01L 2924/0665* (2013.01)

(56) References Cited

U.S. PATENT DOCUMENTS

| | | | | |
|---|---|---|---|---|
| 2014/0264856 | A1* | 9/2014 | Huang | H01L 23/49894 438/126 |
| 2015/0155243 | A1* | 6/2015 | Chen | H01L 24/83 438/107 |
| 2018/0053723 | A1* | 2/2018 | Hu | H01L 25/0655 |
| 2018/0294229 | A1 | 10/2018 | Hu | |
| 2021/0242172 | A1 | 8/2021 | Wang et al. | |
| 2021/0249361 | A1 | 8/2021 | Brunner et al. | |
| 2021/0375785 | A1 | 12/2021 | Wu et al. | |

FOREIGN PATENT DOCUMENTS

| | | |
|---|---|---|
| JP | 2007207781 A | 8/2007 |
| JP | 2013214568 A | 10/2013 |
| JP | 2017017048 A | 1/2017 |
| TW | 201250961 A | 12/2012 |
| TW | 201944569 A | 11/2019 |
| TW | 202025313 A | 7/2020 |
| TW | 202117945 A | 5/2021 |
| TW | 202117947 A | 5/2021 |
| TW | 202129893 A | 8/2021 |
| TW | 202209618 A | 3/2022 |

OTHER PUBLICATIONS

TW Patent and Trademark Office; TW Application No. 112109113; Office Action mailed Sep. 24, 2024; 14 pages.

TW Patent and Trademark Office; TW Application No. 112109113; Office Action mailed Jul. 3, 2024; 16 pages.

TW Patent and Trademark Office; TW Application No. 112109113; Office Action mailed Mar. 26, 2025; 20 pages.

\* cited by examiner

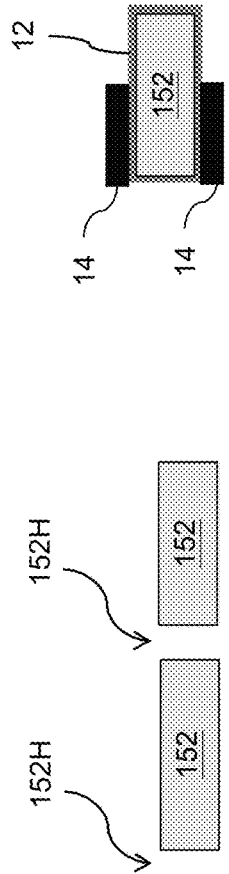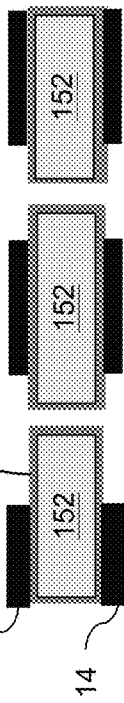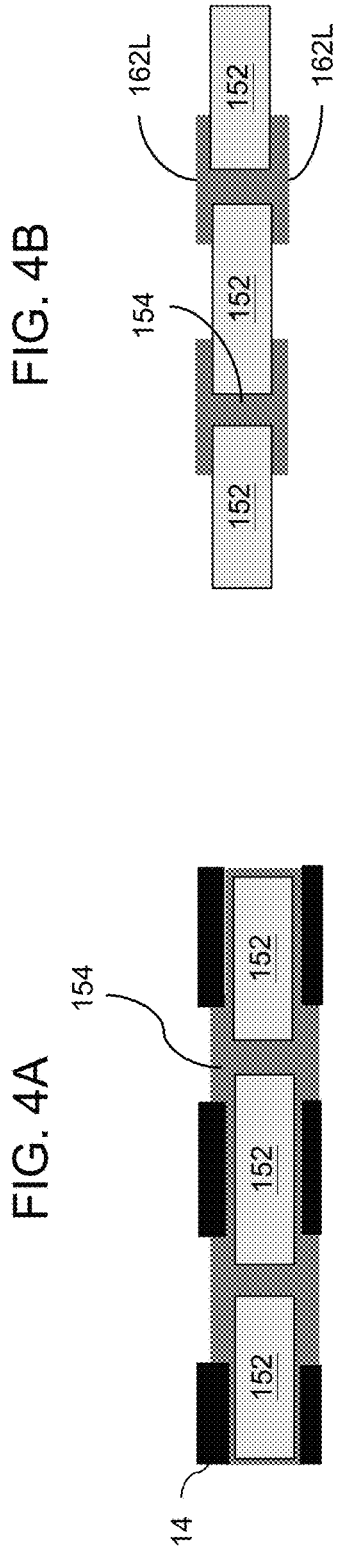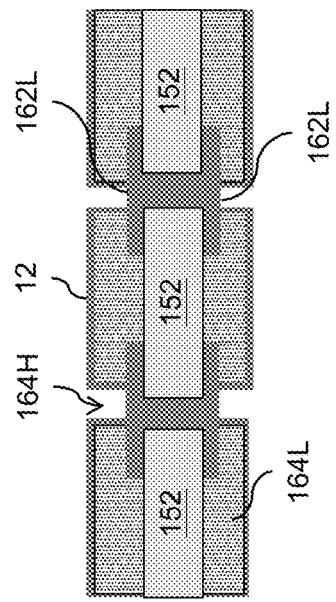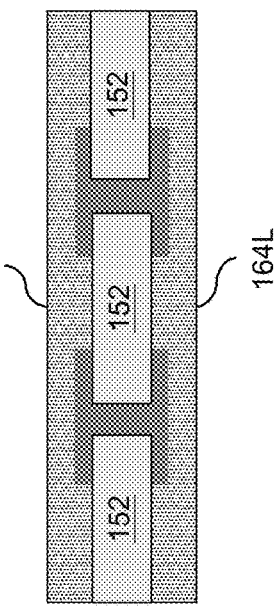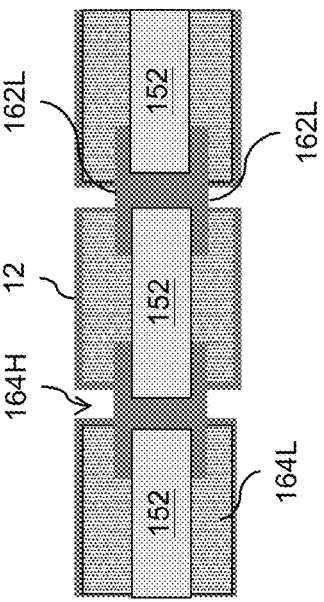

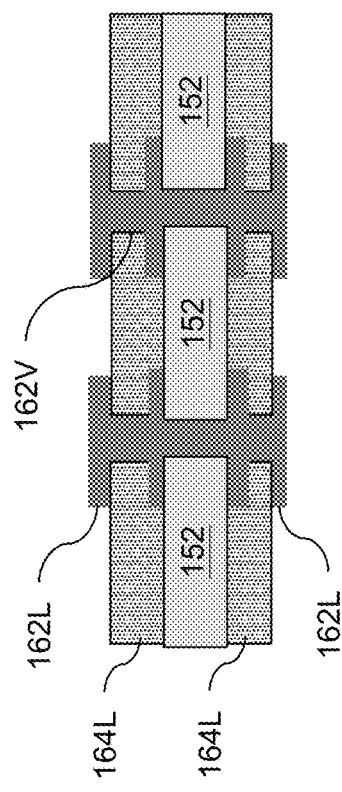
FIG. 4H
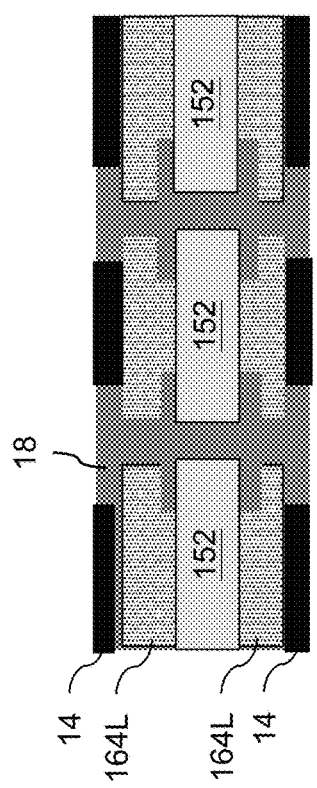
FIG. 4G
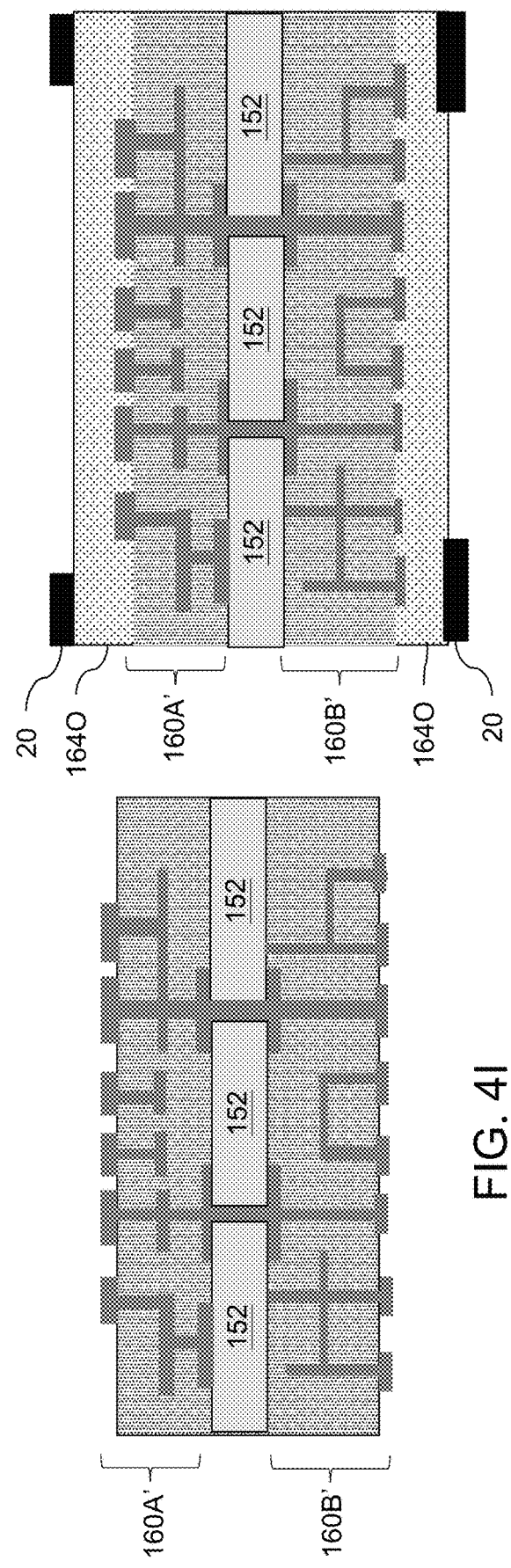
FIG. 4J
FIG. 4I

SEMICONDUCTOR PACKAGE INCLUDING REINFORCEMENT STRUCTURE AND METHODS OF FORMING THE SAME

BACKGROUND

The semiconductor industry has continually grown due to continuous improvements in integration density of various electronic components, e.g., transistors, diodes, resistors, capacitors, etc. In large part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these 3D devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

Interfaces between a fan-out wafer level package (FOWLP) and an underfill material are subjected to mechanical stress during subsequent handling of an assembly of the FOWLP, the underfill material, and a packaging substrate, such as the mechanical stress associated with attaching the packaging substrate to a printed circuit board (PCB). In addition, interfaces between a fan-out wafer level package (FOWLP) and an underfill material are subjected to mechanical stress during use within a computing device, such as when a mobile device is accidently dropped to cause a mechanical shock during usage. Cracks may be formed in the underfill material, and may induce additional cracks in a semiconductor die, solder materials, interposer structures, and/or various dielectric layers within a semiconductor die or within a package substrate. Thus, formation of cracks in the underfill material should be suppressed.

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
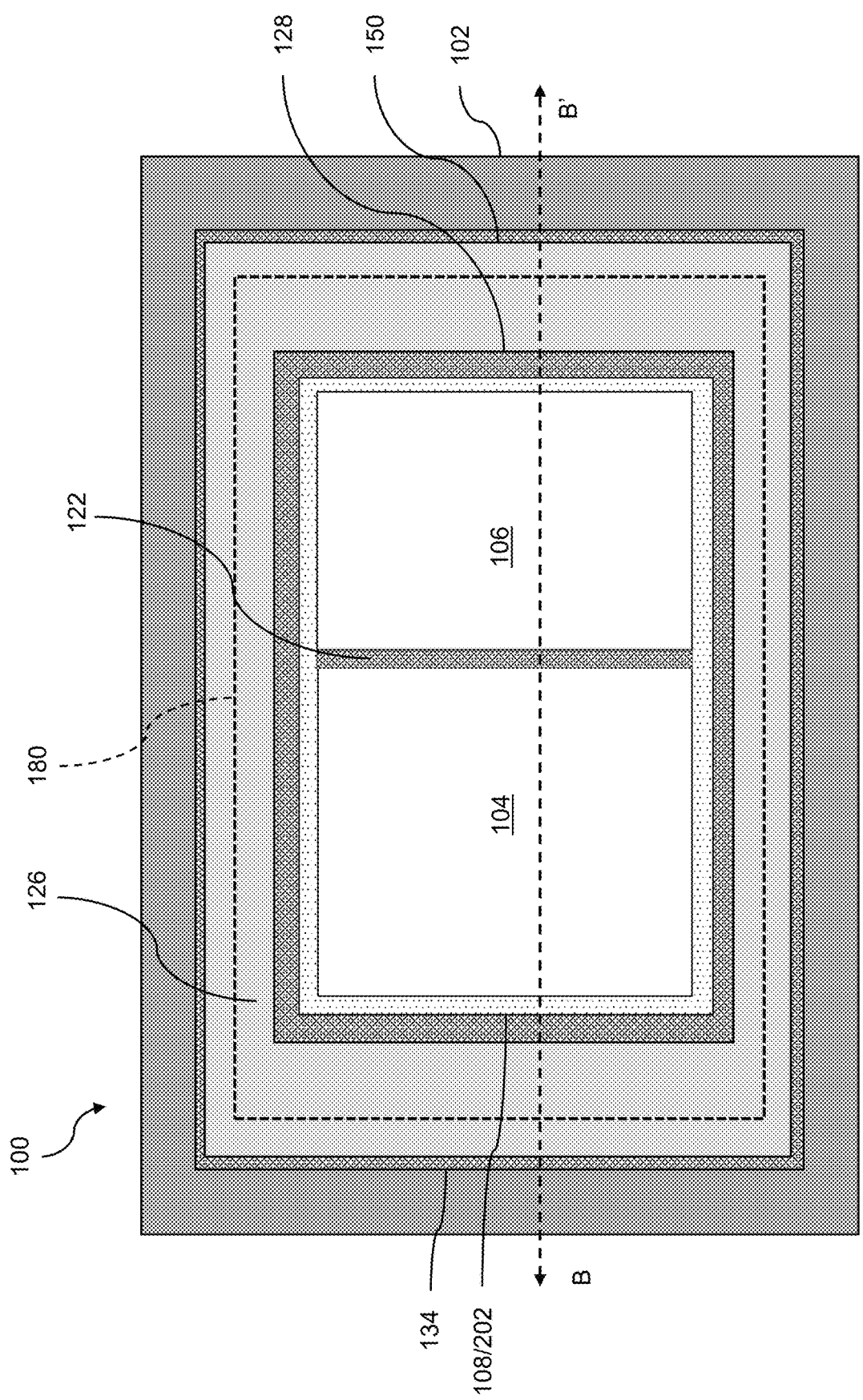
FIG. 1A is a top-down view of a semiconductor package, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package a number of semiconductor integrated circuit (IC) dies (i.e., "chips") may be mounted onto a common substrate, which may also be referred to as a "package substrate." In some instances, electrical connections to the semiconductor package may be made by mounting the package substrate onto a support substrate containing electrical interconnects, such as a printed circuit board (PCB). In some semiconductor packages, such as in a fan out wafer level package (FOWLP) and/or fan-out panel level package (FOPLP), a plurality of semiconductor IC dies may be mounted to an interposer, such as an organic interposer or a semiconductor (e.g., silicon) interposer, that may include interconnect structures extending therethrough. The resulting semiconductor package structure, including the interposer and the semiconductor IC dies mounted thereon, may then be mounted onto a surface of a package substrate using solder connections. An underfill layer may be provided in the space between the interposer and the package substrate to encapsulate the solder connections and improve the structural coupling between the interposer and the package substrate. Generally, the methods and structures of the present disclosure may be used to provide a package substrate such as a FOWLP and fan-out panel level package (FOPLP). While the present disclosure is described using an FOWLP configuration, the methods and structures of the present disclosure may be implemented in an FOPLP configuration or any other package configuration.

In related semiconductor packages, the coefficient of thermal expansion (CTE) differences among the various components contained in a semiconductor package may result in high amounts of thermal-mechanical stress. The different rates of thermal expansion and contraction may result in a warpage of the semiconductor package. Such warpage may result in the formation of cracks and/or dislocations among the various devices and layers in the semiconductor package. Accordingly, various embodiments are disclosed herein to provide semiconductor packages that include components configured to reduce the amount of thermal-mechanical stress applied to the semiconductor packages so as to mitigate the formation of cracks and/or dislocations. Reinforcement structures may be provided that are embedded within a package substrate. According to various embodiments the reinforcement structures may be configured to provide increased mechanical support to the package substrate to thereby reduce or eliminate mechanical distortions such as the warping of the package substrate. The reinforcement structure may therefore be chosen to have a mechanical strength (e.g., bulk modulus) that is greater than that of the package substrate. The reinforcement structures may be formed of a material having a higher Young's modulus than that of the dielectric structure 164. For example, the reinforcement structure 180 may have a Young's modulus of greater than 13 GPa, such as a Young's modulus of at least 14 GPa, at least 15 GPa, or at least 20 GPa.

Figure 1B:
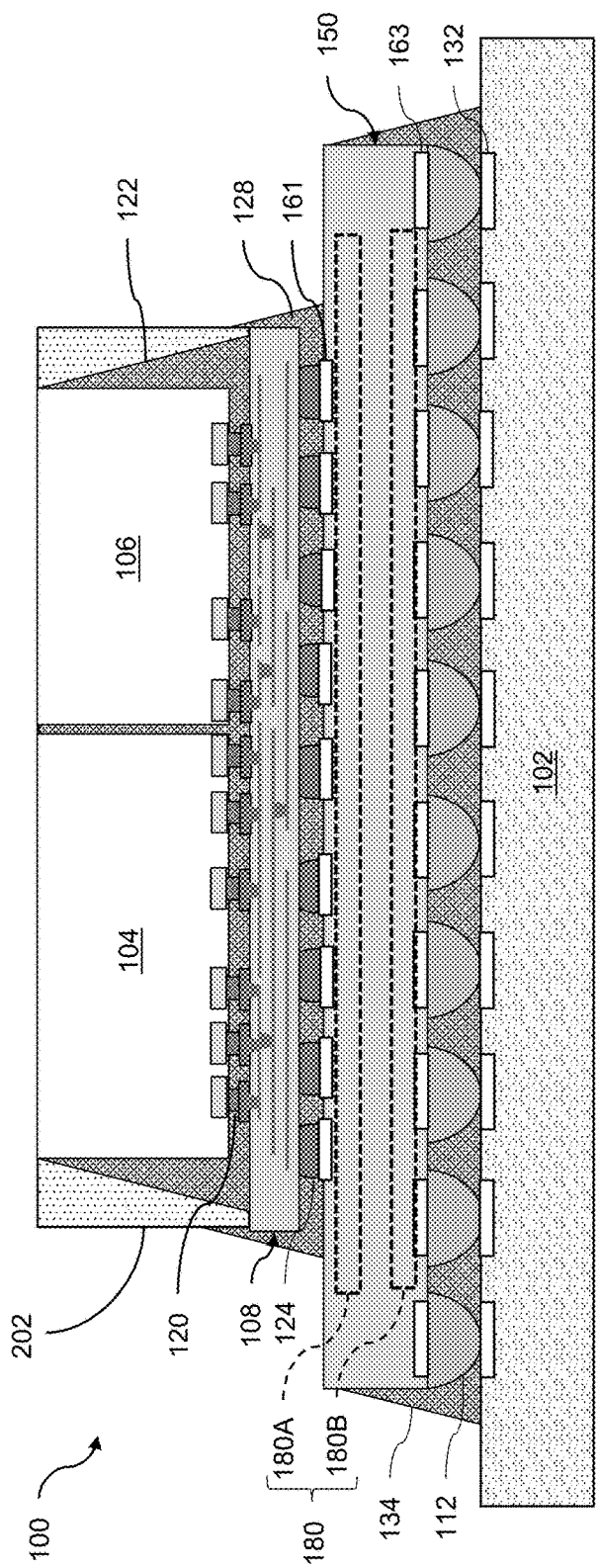
FIG. 1B is a vertical cross-sectional view taken along line B-B' of FIG. 1A.
Figure 1C:
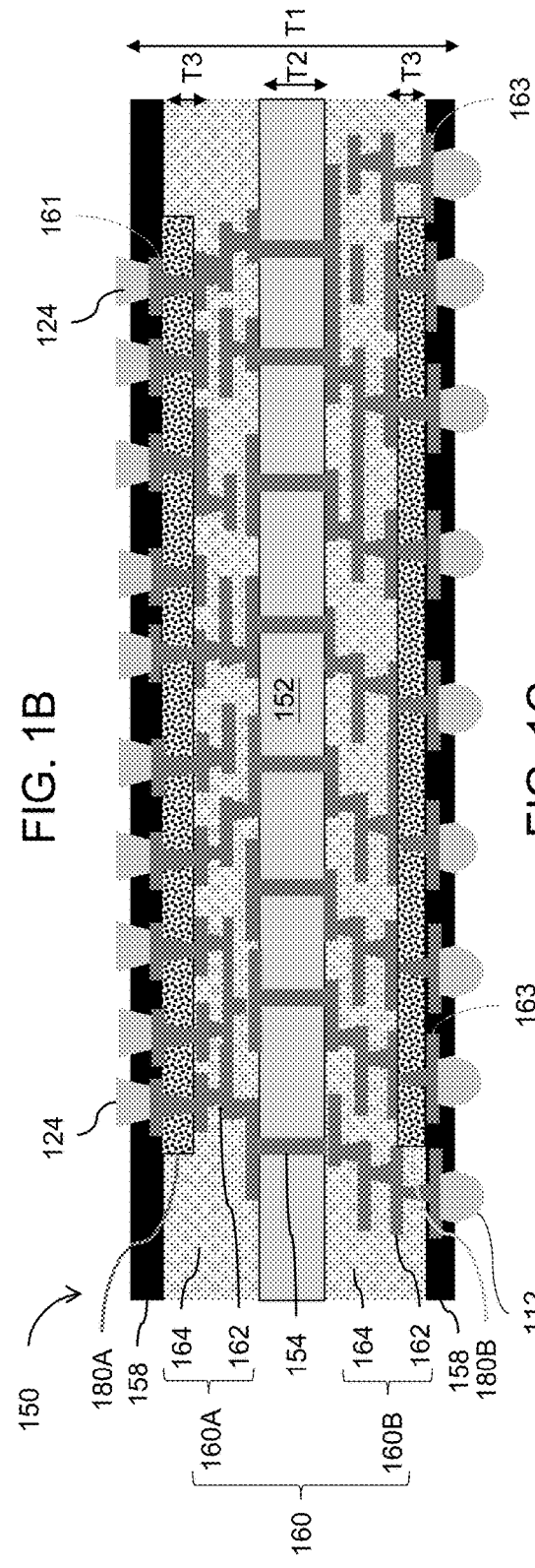
FIG. 1C is an enlarged vertical cross-sectional view of a package substrate of FIG. 1A.

FIG. 1A is a top-down view of a semiconductor package 100, according to various embodiments of the present disclosure. FIG. 1B is a cross-sectional view taken along line B-B' of FIG. 1A. FIG. 1C is an enlarged view of a package substrate 150 of FIG. 1A.

Referring to FIGS. 1A-1C, the semiconductor package 100 may be mounted on a support substrate 102, such as a printed circuit board (PCB). The semiconductor package 100 in this example is a chip-on-wafer-on-substrate (CoWoS)® semiconductor package although it will be understood that a similar assembly and mounting process may be utilized for other types of semiconductor packages, such as integrated fan-out (InFO) semiconductor packages, flip-chip semiconductor packages, etc.

The package 100 may include integrated circuit (IC) semiconductor devices, such as first IC semiconductor devices 104 and second IC semiconductor devices 106. In various embodiments, the first IC semiconductor devices 104 may be three-dimensional devices, such as three-dimensional integrated circuits (3DICs), System on Chip (SOC) or System on Integrated Circuit (SoIC) devices. A three-dimensional IC semiconductor device 104 may be formed by placing chips over chips on a semiconductor wafer level. These three-dimensional devices may provide improved integration density and other advantages, such as faster speeds and higher bandwidths, due to a decreased length of interconnects between the stacked chips. In some embodiments, a first three-dimensional IC semiconductor device 104 may also be referred to as a "first die stack."

The second IC semiconductor device(s) 106 may be different from the first IC semiconductor device(s) 104 in terms of their structure, design and/or functionality. The one or more second IC semiconductor devices 106 may be three-dimensional IC semiconductor devices, which may also be referred to as "second die stacks." In some embodiments, the one or more second IC semiconductor devices 106 may include a memory device, such as a high bandwidth memory (HBM) device. In the example shown in FIGS. 1A and 1B, the semiconductor package 100 may include a SOC die stack 104 and an HBM die stack 106, although it will be understood that the semiconductor package 100 may include greater or fewer numbers of IC semiconductor devices.

The first IC semiconductor device 104 and the second IC semiconductor device 106 may be mounted on an interposer 108, and the interposer 108 may be mounted on a package substrate 150. The package substrate 150 may be mounted on the support substrate 102 using an array of solder balls 112 between lower substrate side bonding pads 163 to device side bonding pads 132 of the support substrate 102.

In some embodiments, the interposer 108 may be an organic interposer including a polymer dielectric material (e.g., a polyimide material) having a plurality of metal interconnect structures extending therethrough. In other embodiments, the interposer 108 may be a semiconductor interposer, such as a silicon interposer, having a plurality of interconnect structures (e.g., through-silicon vias) extending therethrough. Other suitable configurations for the interposer 108 are within the contemplated scope of the disclosure. The interposer 108 may include a plurality of conductive bonding pads on upper and lower surfaces of the interposer and a plurality of conductive interconnects extending through the interposer 108 between the upper and lower bonding pads of the interposer 108. The conductive interconnects may distribute and route electrical signals between the first IC semiconductor devices 104, the second IC semiconductor devices 106, and the underlying package substrate 150. Thus, the interposer 108 may also be referred to as a redistribution layer (RDL).

Metal bumps 120, such as microbumps, may electrically connect conductive bonding pads on the bottom surfaces of both the first IC semiconductor devices 104 and second IC semiconductor devices 106 to the conductive bonding pads on the upper surface of the interposer 108. In one non-limiting embodiment, metal bumps 120 in the form of microbumps may include a plurality of first metal stacks, such as a plurality of Cu—Ni—Cu stacks, located on the bottom surfaces of the first IC semiconductor devices 104 and second IC semiconductor devices 106, and a plurality of second metal stacks (e.g., Cu—Ni—Cu stacks) located on the upper surface of the interposer 108. A solder material, such as tin (Sn), may be located between respective first and second metal stacks to electrically connect the first IC semiconductor devices 104 and the second IC semiconductor devices 106 to the interposer 108. Other suitable materials for the metal bumps 120 are within the contemplated scope of disclosure.

After the first IC semiconductor devices 104 and second IC semiconductor devices 106 are mounted to the interposer 108, a first underfill material 122 may optionally be provided in the spaces surrounding the metal bumps 120 and between the bottom surfaces of the first IC semiconductor devices 104, the second IC semiconductor devices 106, and the upper surface of the interposer 108. The first underfill material 122 may also be provided in the spaces laterally separating adjacent first IC semiconductor devices 104 and second IC semiconductor devices 106 of the semiconductor package 100. In various embodiments, the first underfill material 122 may be include of an epoxy-based material, which may include a composite of resin and filler materials.

The interposer 108 may be mounted on the package substrate 150 that may provide mechanical support for the interposer 108 and the first IC semiconductor devices 104 and second IC semiconductor devices 106 that are mounted on the interposer 108. The package substrate 150 may include a suitable material, such as an organic material (e.g., a polymer and/or thermoplastic material), a semiconductor material (e.g., a semiconductor wafer, such as a silicon wafer), a ceramic material, a glass material, combinations thereof, or the like. Other suitable substrate materials are within the contemplated scope of present disclosure. In various embodiments, the package substrate 150 may include a plurality of conductive bonding pads (not shown) in an upper surface of the package substrate 150. Metal bumps 124, such as C4 solder bumps, may electrically connect conductive bonding pads (not shown) on the bottom surface of the interposer 108 to upper bonding pads 161 of the package substrate 150. In various embodiments, the metal bumps 124 may include a suitable solder material, such as tin (Sn), although other suitable solder materials are within the contemplated scope of disclosure.

A second underfill material 128 may be provided in the spaces surrounding the metal bumps 124 and between the bottom surface of the interposer 108 and the upper surface of the package substrate 150 as illustrated, for example, in FIG. 1B. In various embodiments, the second underfill material 128 may include an epoxy-based material, which may include a composite of resin and filler materials. In some embodiments, a lid or cover (not shown in FIGS. 1A and 1B) may be mounted to the package substrate 150 and may provide an enclosure around the upper and side surfaces of the first IC semiconductor devices 104 and second IC semiconductor devices 106.

The package substrate 150 may be mounted to the support substrate 102, such as a printed circuit board (PCB). Other suitable support substrates 102 are within the contemplated scope of disclosure.

In various embodiments, the package substrate 150 may be a multi-layer structure including a substrate core 152, substrate via structures 154, a redistribution structure 160, and at least one coating layer 158. A reinforcement structure 180 may be embedded in the redistribution structure 160. The package substrate 150 may have a thickness T1 that ranges from approximately 300 microns to approximately 2,000 microns. The substrate core 152 may have a core thickness T2 that ranges from approximately 200 microns to 1,600 microns.

In some embodiments, the redistribution structure 160 may include an upper redistribution layer 160A disposed above the substrate core 152 and a lower redistribution layer 160B disposed below the substrate core 152. The coating layers 158 may be disposed on outer surfaces of the upper redistribution layer 160A and the lower redistribution layer 160B.

The substrate core 152 may include an organic material (e.g., a polymer and/or thermoplastic material), a semiconductor material (e.g., a semiconductor wafer, such as a silicon wafer), a ceramic material, a glass material, combinations thereof, etc. For example, the substrate core 152 may include an epoxy-based material, which may include a composite of resin and filler materials. The substrate core 152 may be formed in a slab geometry. The via structures 154 may be disposed in through-holes formed in the substrate core 152.

The redistribution structure 160 may include metal features 162, such as metal lines and via structures, embedded in a dielectric structure 164. In some embodiments, the dielectric structure 164 may include multiple layers of a dielectric material, such as a photosensitive epoxy material. For example, the dielectric structure 164 may be a build-up film, such as a GL102 build-up film available form Ajinomoto Group. Each layer of dielectric structure 164 may be lithographically patterned to form open regions (e.g., trenches and via openings) within the respective layers of dielectric structure 164.

A metallization process may be used to fill the open regions with a suitable conductive material, such as copper or a copper-alloy, within each layer of dielectric material to form the metal features 162 embedded within the dielectric structure 164. The coating layers 158 may include a solder resist material formed over the respective upper redistribution layer 160A and lower redistribution layer 160B. Each of the coating layers 158 may provide a protective coating for the package substrate 150 and the underlying metal features 162. The coating layers 158 formed of solder resist material may also be referred to as a "solder mask."

The solder balls (or bump structures) 112 may electrically connect the lower substrate side bonding pads 163 to device side bonding pads 132 of the support substrate 102. In various embodiments, each of the upper bonding pads 161 and the lower bonding pads 163 in different regions of the package substrate 150 may have the same size and shape. The upper bonding pads 161 and the lower bonding pads 163 may be disposed the dielectric structure 164. Alternatively, the upper bonding pads 161 and the lower bonding pads 163 may be embedded in the dielectric structure 164.

The solder balls 112 may be provided over the respective conductive bonding pads 132. In one non-limiting example, the lower bonding pads 163 may have a width dimension that is between about 500 μm and about 550 μm (e.g., ~530 μm), and the solder balls 112 may have an outer diameter that may be between about 600 μm and about 650 μm (e.g., ~630 μm), although greater and lesser dimensions for the solder balls 112 and/or the lower bonding pads 163 are within the contemplated scope of disclosure.

A first solder reflow process may include subjecting the package substrate 150 to an elevated temperature (e.g., at least about 250° C.) in order to melt the solder balls 112 and cause the solder balls 112 to adhere to the lower bonding pads 163. Following the first reflow process, the package substrate 150 may be cooled causing the solder balls 112 to re-solidify. Each solder ball 112 may extend from the lower surface the package substrate 150 by a vertical height that may be less than the outer diameter of the solder ball 112 prior to the first reflow process. For example, where the outer diameter of the solder ball 112 is between about 600 μm and about 650 μm (e.g., ~630 μm), the vertical height of the solder ball 112 following the first reflow process may be between about 500 μm and about 550 μm (e.g., ~520 μm).

In various embodiments, mounting of the package substrate 150 onto the support substrate 102, may include aligning the package substrate 150 over the support substrate 102, such that the solder balls 112 contacting the lower bonding pads 163 of the package substrate 150 may be located over corresponding bonding pads (e.g., bonding pads 132) on the support substrate 102. A second solder reflow process may then be performed. The second solder reflow process may include subjecting the package substrate 150 to an elevated temperature (e.g., at least about 250° C.) to thereby melt the solder balls 112 and cause the solder balls 112 to adhere to the corresponding bonding pads 132 on the support substrate 102. Surface tension may cause the semi-liquid solder to maintain the package substrate 150 in alignment with the support substrate 102 while the solder material cools and solidifies. Upon solidification of the solder balls 112, the package substrate 150 may sit above the support substrate 102 by a stand-off height that may be between about 0.4 mm to about 0.5 mm, although greater or lesser stand-of heights are within the contemplated scope of disclosure.

A third underfill material 134 may be provided in the spaces surrounding the solder balls 112 and between the lower surface of the package substrate 150 and the upper surface of the support substrate 102. In various embodiments, the third underfill material 134 may include an epoxy-based material, which may include a composite of resin and filler materials.

The semiconductor package 100 may further include an epoxy molding compound (EMC) that may be applied to gaps formed between the interposer 108, the first IC semiconductor device 104, and the second IC semiconductor device 106, to thereby form a multi-die EMC frame 202. The EMC material may include an epoxy-containing compound that may be hardened (i.e., cured) to provide a dielectric material having sufficient stiffness and mechanical strength. The EMC material may include epoxy resin, hardener, silica (as a filler material), and other additives. The EMC material may be provided in a liquid form or in a solid form depending on the viscosity and flowability.

Liquid EMC may provide better handling, good flowability, fewer voids, better fill, and fewer flow marks. Solid EMC may provide less cure shrinkage, better stand-off, and less die drift. A high filler content (such as 85% in weight) within an EMC material may shorten the time in mold, lower the mold shrinkage, and reduce the mold warpage. A uniform filler size distribution in the EMC material may reduce flow marks, and may enhance flowability. The curing temperature of the EMC material may be in a range from 125° C. to 150° C. The EMC frame 202 may be cured at a curing temperature to form an EMC matrix that laterally encloses each of the first IC semiconductor device 104 and the second IC semiconductor device 106. Excess portions of the EMC frame 202 may be removed from above the horizontal plane including the top surfaces of the semiconductor devices (104, 106) by a planarization process, such as CMP.

The bonding pads 132, 161, 163 may be formed of a suitable conductive material, such as copper. Other suitable conductive materials are within the contemplated scope of disclosure. The solder balls 112 may include any suitable solder material, such as tin, lead, silver, indium, zinc, nickel, bismuth, antimony, cobalt, copper, germanium, alloys thereof, combinations thereof, or the like. Other suitable materials for the solder balls 112 are within the contemplated scope of disclosure.

The solder balls 112 may form an array of solder balls 112, such as a ball grid array (BGA) that may include an array pattern that corresponds to an array pattern of the bonding pads 132 on the upper surface of the support substrate 102. In one non-limiting example, the array of solder balls 112 may include a grid pattern and may have a pitch (i.e., distance between the center of each solder ball 112 and the center of each adjacent solder ball 112). In an example embodiment, the pitch may be between about 0.8 and 1.0 mm, although larger and smaller pitches may be used.

Package Reinforcement Structures

A parameter that may ensure proper interconnection between the package substrate 150 and the support substrate 102 is the degree of co-planarity between the surfaces of the solder balls 112 that may be brought into contact with the mounting surface (i.e., the upper surface of the support substrate 102). A low amount of co-planarity between the solder balls 112 may result in instances of solder cold joints (i.e., insufficient melting of the solder material, resulting in a poor bond that is susceptible to cracking and separation) and/or solder bridging issues (i.e., solder material from one solder ball 112 contacting material from a neighboring solder ball 112, resulting in an unintended connection (i.e., electrical short)) during the reflow process.

Deformation of the package substrate 150, such as stress-induced warping of the package substrate 150, may be a contributor to low co-planarity of the solder balls 112 during surface mounting of the package substrate 150 onto a support substrate 102. Warpage of the package substrate 150 may result in variations of the distance between the lower surface of the package substrate 150 and the upper surface support substrate 102. Such deformation of the package substrate 150 may increase the risk of defective solder connections with the underlying support substrate 102. For example, deformation of the package substrate 150 may cause at least some of the solder joints between the package substrate 150 and the support substrate 102 to fail completely. The deformation of the package substrate 150 may have a bow-shape or cup-shape such that a separation between the lower surface of the package substrate 150 and the upper surface of the support substrate 102 may be smallest at the periphery of the package substrate 150 and may increase towards the center of the package substrate 150.

Deformation of a package substrate is not an uncommon occurrence, particularly in the case of semiconductor packages used in high-performance computing applications. High-performance semiconductor packages 100 tend to be relatively large and may include a number of IC semiconductor devices (e.g., 104, 106) mounted to the package substrate 150, which may increase a likelihood that the package substrate 150 may be subject to warping or other deformations. Such deformations may present challenges to effective solder mounting of these types of semiconductor package substrates 150 onto a support substrate 102.

According to various embodiments the reinforcement structure 180 may be configured to provide increased mechanical support to the package substrate 150 to thereby reduce or eliminate mechanical distortions such as the warping of the package substrate 150. The reinforcement structure 180 may therefore be chosen to have a mechanical strength (e.g., bulk modulus) that is greater than that of the package substrate 150. For example, the reinforcement structure 180 may be configured to reduce and/or prevent deformation of the package substrate 150, so that the co-planarity of the solder balls 112 and/or metal bumps 124 may be improved, thereby providing an improved solder connection between the package substrate 150 and the support substrate 102 and/or the interposer 108.

The package substrate 150 may include an organic material (e.g., a polymer and/or thermoplastic material), a semiconductor material (e.g., a semiconductor wafer, such as a silicon wafer), a ceramic material, a glass material, combinations thereof, etc. As such, the choice of material for the first reinforcement structure 180 may be chosen based on the mechanical properties of the package substrate 150.

For example, the reinforcement structure 180 may be formed of a material having a higher Young's modulus than that of the dielectric structure 164. For example, the reinforcement structure 180 may have a Young's modulus of greater than 13 GPa, such as a Young's modulus of at least 14 GPa, at least 15 GPa, or at least 20 GPa. In some embodiments, the reinforcement structure 180 may have a Young's modulus ranging from 14 GPa to 100 GPa, such as from 15 GPa to 80 GPa, or from 20 GPa to 70 GPa. For example, the reinforcement structure 180 may be formed of silicon, silicon nitride, a ceramic material, a glass material, or the like, having a Young's modulus that exceeds a Young's modulus of the dielectric structure 164, which may generally range from 4 GPa to 15 GPa when formed of conventional dielectric materials, such as polymer materials.

In some embodiments, the reinforcement structure 180 may be disposed in the package substrate 150 and may be disposed between the interposer 108 and the support substrate 102. In some embodiments, the reinforcement structure 180 may be generally rectangular. However, the reinforcement structure 180 may have any suitable peripheral shape. The perimeter of the reinforcement structure 180 may be disposed outside of the perimeter of the interposer 108, when viewed in a vertical direction perpendicular to a plane of the reinforcement structure 180. In other words, the area of the reinforcement structure 180 may be greater than the area of the interposer 108. The perimeter of the reinforcement structure 180 may be disposed inside of the perimeter of the package substrate 150. In other words, the area of the reinforcement structure 180 in the vertical direction may be less than the area of the package substrate 150 taken in the vertical direction.

The reinforcement structure 180 may include one or more reinforcement layers embedded in the package substrate 150. For example, as shown in FIGS. 1B and 1C, the reinforcement structure 180 may include an upper reinforcement layer 180A embedded in the upper redistribution layer 160A and a lower reinforcement layer 180B embedded in the lower redistribution layer 160B. In some embodiments, the upper reinforcement layer 180A and the lower reinforcement layer 180B may have substantially the same size and/or shape. However, on other embodiments, dimensions of the upper reinforcement layer 180A and the lower reinforcement layer 180B may vary in shape and size from one another.

In some embodiments, the upper reinforcement layer 180A may be disposed between the upper bonding pads 161 and uppermost conductive lines of the metal features 162. The uppermost the metal features 162 of the upper redistribution layer 160A may extend through the upper reinforcement layer 180A. The lower reinforcement layer 180B may be disposed between the lower bonding pads 163 and lowermost conductive lines of the metal features 162 of the lower redistribution layer 160B. The lowermost via structures of the metal features 162 of the lower redistribution layer 160B may extend through the lower reinforcement layer 180B.

A total thickness of the reinforcement structure 180, taken in a vertical direction perpendicular to a plane of the package substrate 150 (i.e., a total thickness of all reinforcement layers included in the reinforcement structure 180) may be less than or equal to a total thickness of the upper redistribution layer 160A and the lower redistribution layer 160B the redistribution structure 160 (i.e., a combined thickness of the upper redistribution layer 160A and the lower redistribution layer 160B) taken in the vertical direction. For example, the total thickness of the reinforcement structure 180 may range from 10 µm to 164 µm, such as from 10 µm to 100 µm, from 10 µm to 50 µm, or from 10 µm to 20 µm. Accordingly, a thickness T3 of the upper reinforcement layer 180A and/or a thickness T3 of the lower reinforcement layer 180B may be less than or equal to the thickness of the corresponding upper redistribution layer 160A and lower redistribution layer 160B. For example, the thickness of the upper reinforcement layer 180A and/or a thickness of the lower reinforcement layer 180B may range from 5 µm to 82 µm, such as from 10 µm to 50 µm, from 10 µm to 30 µm, from 10 µm to 20 µm, or about 15 µm.

Figure 2A:
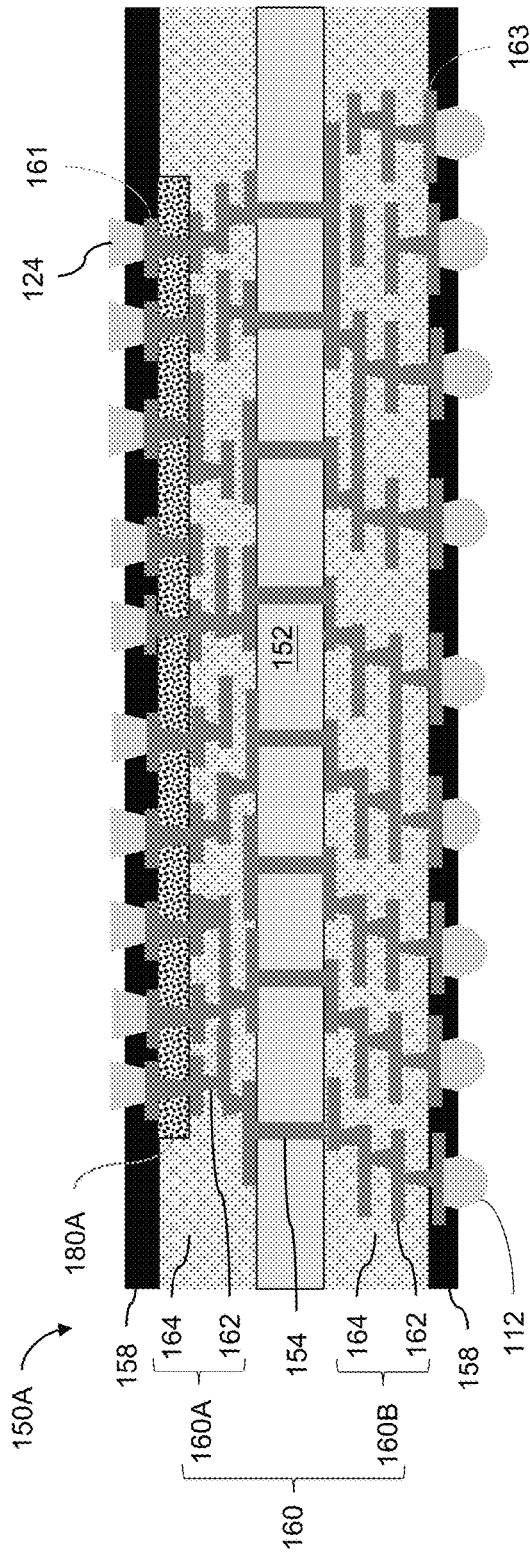
FIG. 2A is a vertical cross-sectional view of an alternative package substrate 150A that may be included in the semiconductor package 100, according to various embodiments of the present disclosure.

FIG. 2A is a vertical cross-sectional view of an alternative package substrate 150A that may be included in the semiconductor package 100, according to various embodiments of the present disclosure. The package substrate 150A may be similar to the package substrate 150 of FIG. 1C. As such, only the differences therebetween will be discussed in detail.

Referring to FIG. 2A, the package substrate 150B may include a reinforcement structure that includes only an upper reinforcement layer 180A embedded in the upper redistribution layer 160A. In other words, the lower reinforcement layer 180B of FIG. 1C may be omitted. The upper reinforcement layer 180A may be disposed between the upper bonding pads 161 and adjacent metal lines of the conductive features 162 of the upper redistribution layer 160A. However, the upper reinforcement layer 180A is not limited to being disposed at any particular depth within the upper redistribution layer 160A.

Figure 2B:
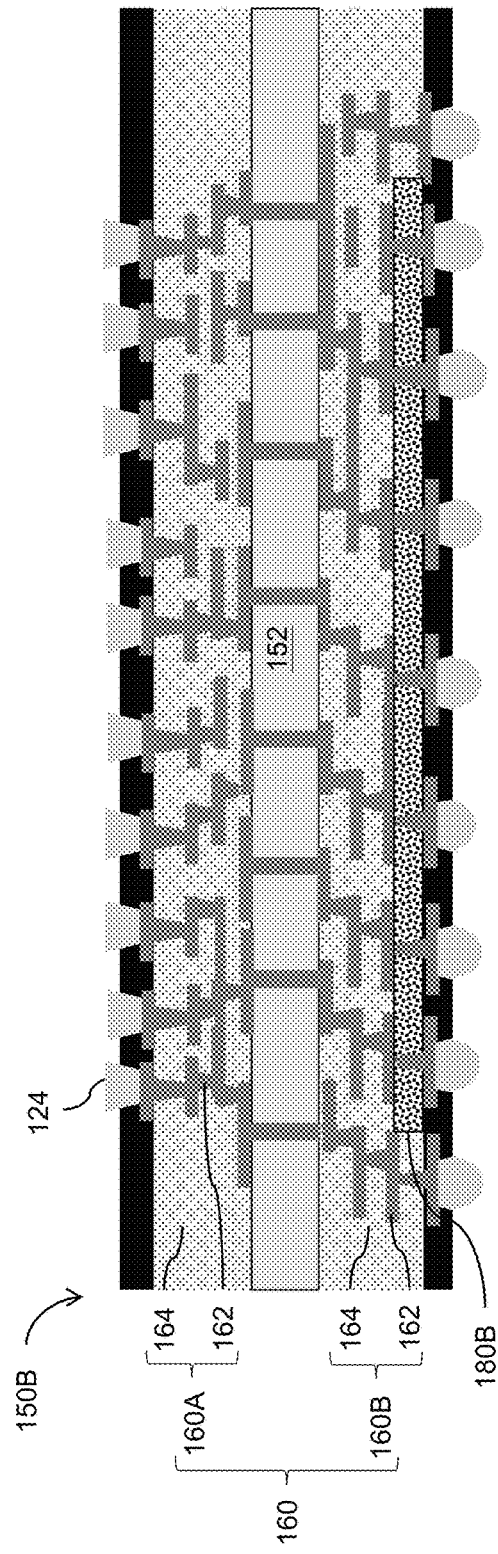
FIG. 2B is a vertical cross-sectional view of another alternative package substrate 150B that may be included in the semiconductor package 100, according to various embodiments of the present disclosure.

FIG. 2B is a vertical cross-sectional view of another alternative package substrate 150B that may be included in the semiconductor package 100, according to various embodiments of the present disclosure. The package substrate 150B may be similar to the package substrate 150 of FIG. 1C. As such, only the differences therebetween will be discussed in detail.

Referring to FIG. 2B, the package substrate 150B may include a reinforcement structure that comprises only a lower reinforcement layer 180B embedded in the lower redistribution layer 160B. In other words, the upper reinforcement layer 180A of FIG. 1C may be omitted. The lower reinforcement layer 180B may be disposed between the lower contact pads 163 and adjacent metal lines of the conductive features 162 of the lower redistribution layer 160B. However, the lower reinforcement layer 180B is not limited to being disposed at any particular depth within the lower redistribution layer 160B.

Accordingly, as shown in FIGS. 1C-2B, the reinforcement structure 180 may include a single reinforcement layer disposed in either the upper redistribution layer 160A or the lower redistribution layer 160B, or may include two or more reinforcement layers. Alternatively, the upper reinforcement layer 180A and/or the lower reinforcement layer 180B may be continuous layers, or may be discontinuous layers including several disconnected portions (not shown). Further, the reinforcement structure 180 may be located below semiconductor devices connected to a package substrate in which the reinforcement structure 180 is embedded. However, in other embodiments, the reinforcement structure 180 may be disposed in any region of a package substrate 150 that may be subject to mechanical distortions such as warping.

Figure 3:
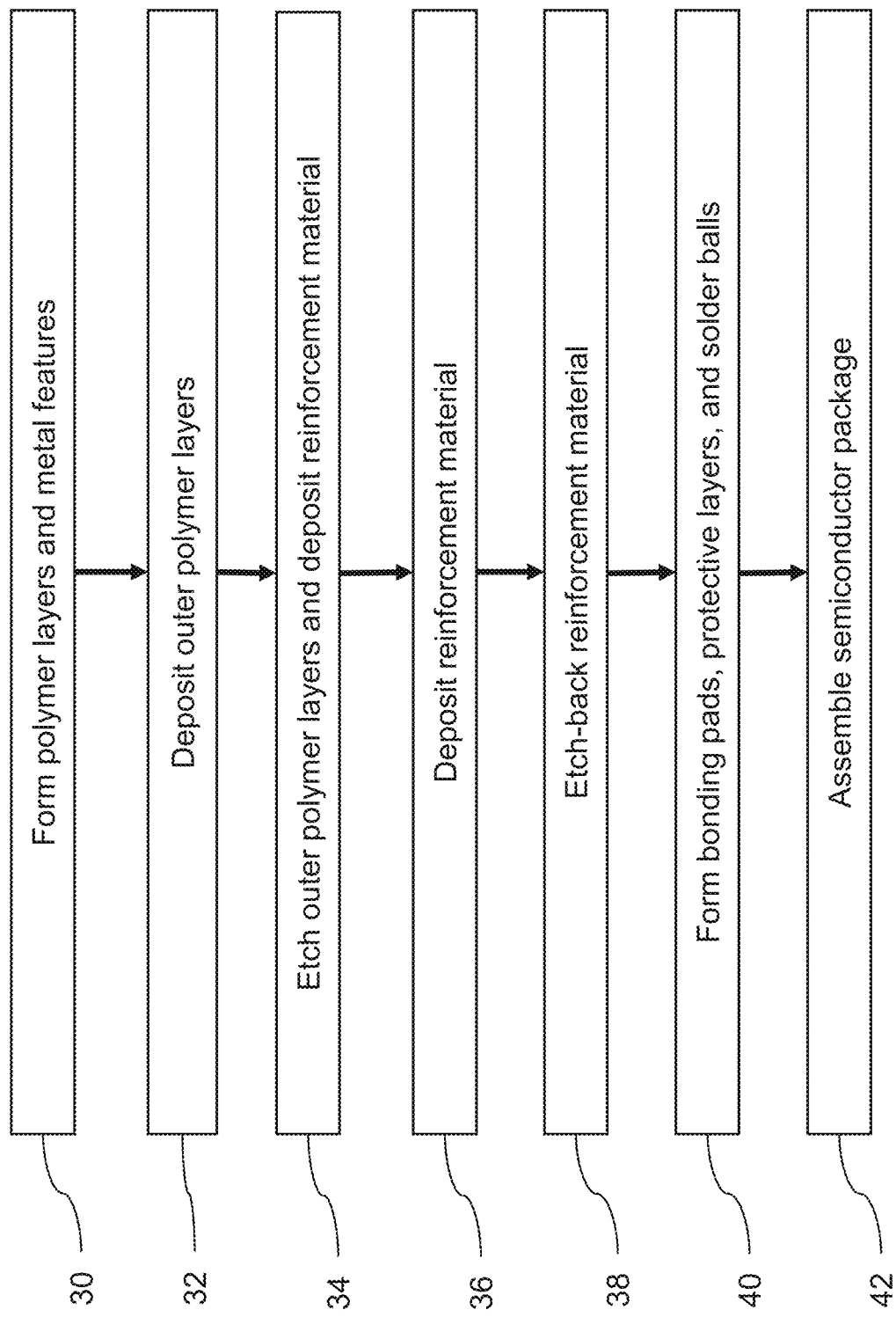
FIG. 3 is a flow diagram including operations of a method of forming a package substrate 300, according to various embodiments of the present disclosure.

FIG. 3 is a process flow diagram including operations of a method of forming a package substrate 100, according to various embodiments of the present disclosure. FIGS. 4A-4O are vertical cross-sectional views illustrating intermediate structures formed during operations of the method of FIG. 3.

Referring to FIGS. 3 and 4A-4I, in operation 30, through holes 152H may be formed in a substrate core 152. The substrate core 152 may include an organic material (e.g., a polymer and/or thermoplastic material), a semiconductor material (e.g., a semiconductor wafer, such as a silicon wafer), a ceramic material, a glass material, combinations thereof, etc. For example, the substrate core 152 may include an epoxy-based material, which may include a composite of resin and filler materials. The substrate core 152 may be formed in a slab geometry, as described above. The through holes 152H may be drilled or etched or otherwise formed in the substrate core 152.

As shown in FIG. 4B, a copper seed layer 12 may be deposited on the substrate core 152. Patterned photoresist layers 14 may then be formed on opposing sides of the substrate core 152. For example, the photoresist layers 14 may be formed by depositing a photoresist material using a dry film lamination process. The photoresist material may be patterned by a photolithography process to form the patterned photoresist layers 14.

As shown in FIG. 4C, an electroplating process may be performed to form a copper layer 16 on the substrate core 152. As shown in FIG. 4D, the photoresist layer 14 may be removed, and a thin copper etching process may then be performed to form through-substrate via (TSV) structures 154 in the through holes 152H and conductive lines 162L on opposing sides of the substrate core 152.

As shown in FIG. 4E, polymer layers 164L may be deposited on opposing sides of the substrate core 152. The polymer layers 164L may include polyethylene terephthalate (PET), polyimide (PI), an epoxy resin, etc. The polymer layers 164L may be formed by vacuum laminating a thin film polymer material on both sides of the substrate core 152. A heat treatment may then be applied to pre-cure the polymer layers 164L. For example, the polymer layers 164L may be subjected to a heat treatment at 100° C. for less than thirty minutes. The heat treatment may cause the polymer layers 164L to soften without appreciably initiating cross-linking reactions. The softened polymer layers 164L may flow and cover underlying gaps.

As shown in FIG. 4F, the polymer layers 164L may then be laser patterned to form through holes 164H. The through holes 164H may expose the conductive lines 162L. A copper seed layer 12 may then be formed on the polymer layers 164L and in the through holes 164H, by any suitable deposition process.

As shown in FIG. 4G, photoresist layers 14 may be formed on the polymer layers 164L. A copper electroplating process may be performed to form a copper plating layer 18 on the polymer layers 164L. As shown in FIG. 4H, the photoresist layer 14 may be removed, and a thin copper etching process may then be performed to form through via structures 162V and conductive lines 162L on opposing sides of the substrate core 152. As shown in FIG. 4I, the operations of FIGS. 4E through 4H may be repeated to form a partial upper redistribution layer 160A' and a partial lower redistribution layer 160B'.

Referring to FIG. 4J, in operation 32, outer polymer layers 164O may be formed on the partial upper redistribution layer 160A' and the partial lower redistribution layer 160B'. A full-curing process may be performed, where the structure of FIG. 4J may be subject to a heat treatment at temperatures between 180° C. to 190° C., for times between 60 and 90 minutes. This full-curing process may cause polymer cross-linking reactions to occur that increase the mechanical strength (i.e., cause hardening) of the polymer layers 164L and outer polymer layers 164O.

Photoresist layers 20 may be formed on the outer polymer layers 164O. The photoresist layers 20 may be provided in the form of a dry polymer film that may be laminated the outer polymer layers 164O. The photoresist layer 20 may be formed by laser patterning a deposited photoresist material.

Figure 4K:
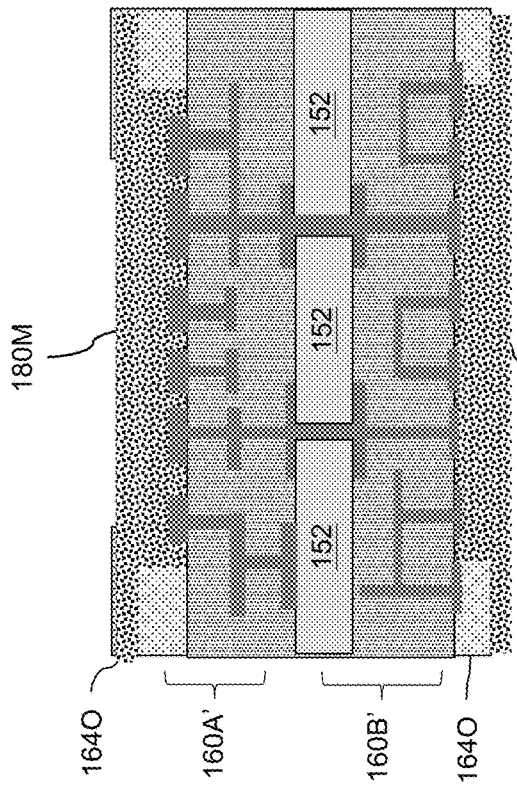
FIGS. 4A-4O are vertical cross-sectional views illustrating intermediate structures formed during operations of the method of FIG. 3.

As shown in FIG. 4K, in operation 34 the outer polymer layers 164O may be etched to form trenches 180T in the outer polymer layers 164O. The dry film photoresist layer 20 may then be removed by dissolution with a solvent (e.g., sodium hydroxide, potassium hydroxide, acetone, etc.).

Figure 4M:
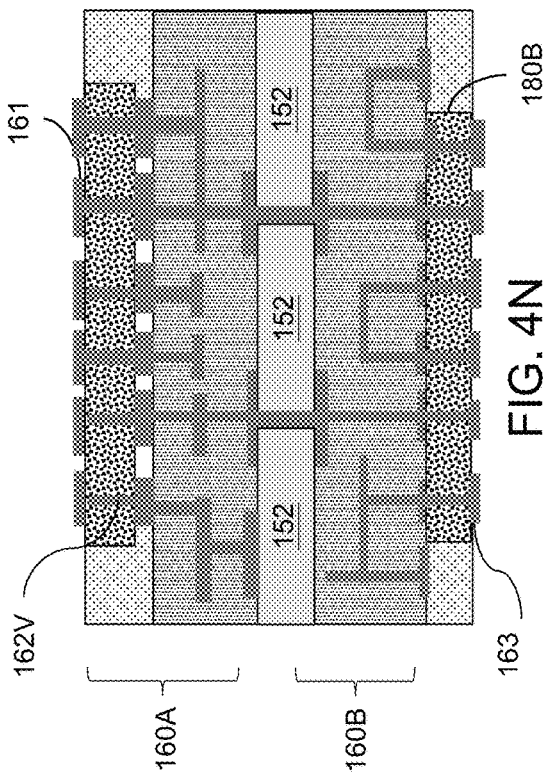
Figure 4L:
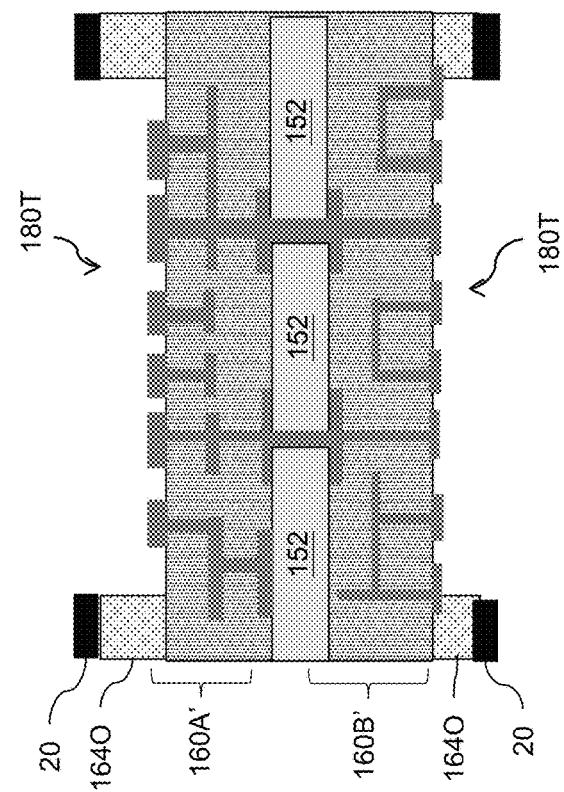

As shown in FIG. 4L, in operation 36, a reinforcement material 180M may be deposited on the outer polymer layers 164O and in the trenches 180T, using any suitable method. As described above, the reinforcement material 180M may be any suitable dielectric material having a Young's modulus of greater than about 14 GPa. As shown in FIG. 4M, in operation 38 and thinning process may be performed on the reinforcement material 180M to form an upper reinforcement layer 180A and a lower reinforcement layer 180B. In some embodiments, the reinforcement material 180M may be thinned using an etch back process. In alternative embodiments, a chemical mechanical polishing (CMP) process may be performed to on the reinforcement material 180M to form an upper reinforcement layer 180A and a lower reinforcement layer 180B to thin the reinforcement material 180M to create a co-planer surface with the outer polymer layers 164O.

Figure 4N:
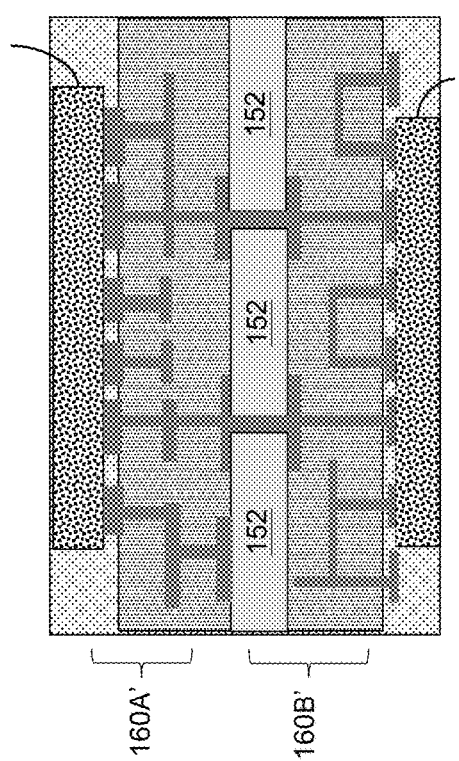
Figure 4O:
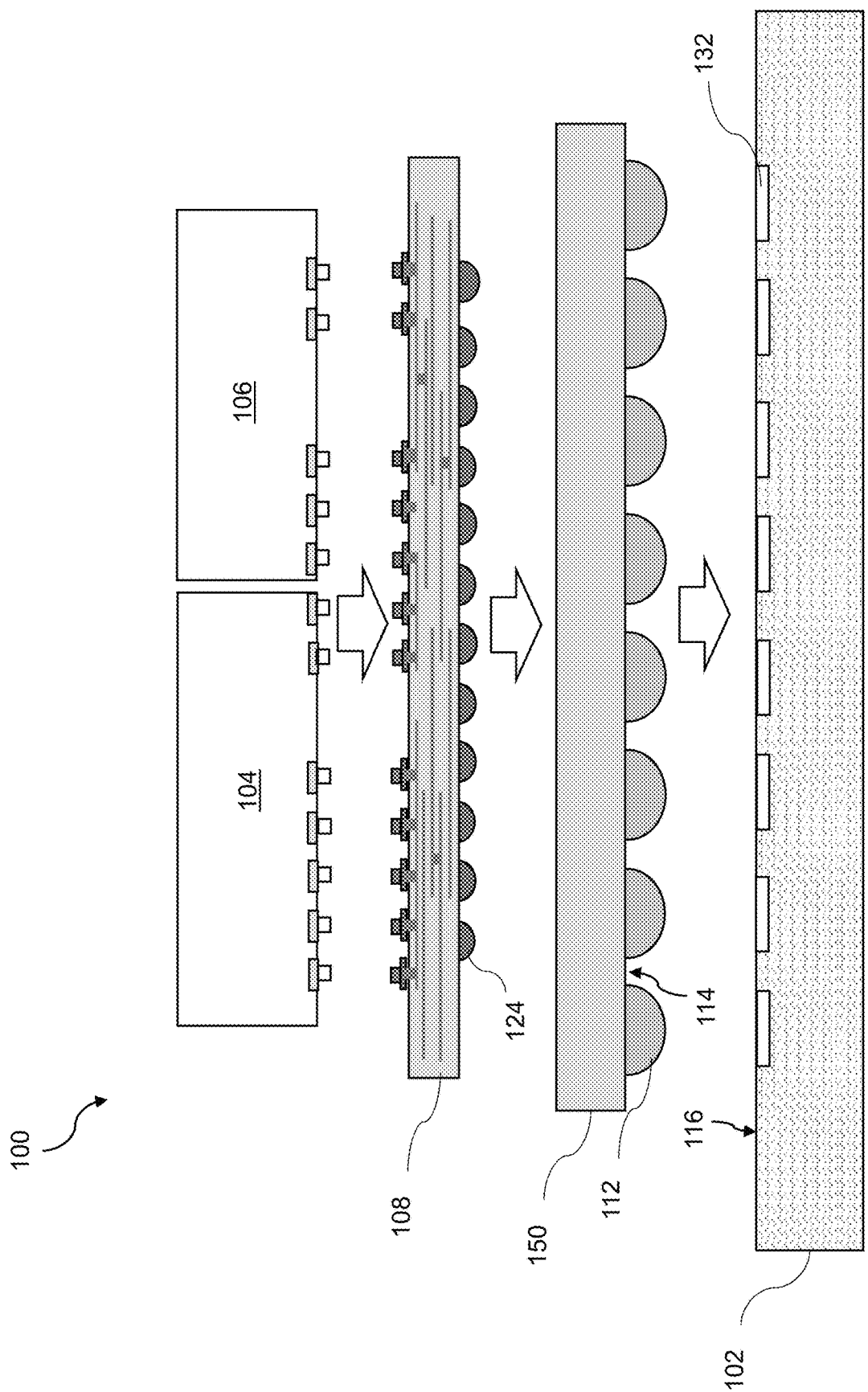

As shown in FIG. 4N, in operation 40 upper bonding pads 161 may be formed on the upper reinforcement layer 180A, and lower bonding pads 163 may be formed on the lower reinforcement layer 180B. In particular, operation 40 may include etching the upper reinforcement layer 180A and the lower reinforcement layer 180B to form vias, a copper seed layer may be deposited, and then a copper layer may be electroplated. An etching process may be performed, to form via structures 162V and the upper and lower bonding pads 161, 163. As a result, an upper redistribution layer 160A and a lower reinforcement layer 160B may be completed. Protective layers 158 and solder balls 112, may be formed on the structure of FIG. 4N, to complete a package substrate 150, as shown in FIG. 1C.

In operation 42, as shown in FIG. 4O, a semiconductor package 100 may be assembled. For example, operation 42 may include attaching, and electrically connecting, semiconductor devices (104, 106) to the package substrate 150. In this regard, the semiconductor devices (104, 106) may be directly connected to the package substrate 150 or may be connected to an interposer 108 which is connected to the package substrate 150. The package substrate 150 may be electrically connected to the support substrate. Operation 42 may also include dispensing a first underfill material 122, a second underfill material 128, and a third underfill material 134, as shown in FIG. 1B, after bonding the semiconductor dies (104, 106), the interposer 108, the package substrate 150, and the support substrate 102.

Referring to all drawings and according to various embodiments of the present disclosure, a semiconductor package 100 is provided. The semiconductor package 100 may comprise a package substrate 150 comprising: a substrate core 152, an upper redistribution layer 160A disposed on a first side of the substrate core 152; and a lower redistribution layer 160B disposed on an opposing second side of the substrate core 152; a semiconductor device 104 vertically stacked on and electrically connected to the backage substrate 150; and an upper reinforcement layer 180A embedded in the upper redistribution layer 160A between the semiconductor device 104 and the substrate core 152, the upper reinforcement layer 180A having a Young's modulus that is higher than a Young's modulus of the upper redistribution layer 160A. In some embodiments, the semiconductor package 100 comprises an interposer 108 electrically connecting the upper redistribution layer 160A and the semiconductor device 104.

In one embodiment, a perimeter of the upper reinforcement layer 180A may be disposed outside of a perimeter of the semiconductor device 104. In one embodiment, the Young's modulus of the upper reinforcement layer 180A ranges from 14 GPa to 100 GPa. In one embodiment, the upper reinforcement layer 180A may have a thickness that is less than or equal to a thickness of the upper redistribution layer 160A. In one embodiment, the thickness of the upper reinforcement layer 180A ranges from 10 μm to 164 μm. In one embodiment, the upper reinforcement layer 180A comprises a dielectric material selected from a silicon, silicon nitride, a ceramic material, or a glass material. In one embodiment, the upper redistribution layer 160A may include metal features embedded in a dielectric structure 164. In one embodiment, the dielectric structure 164 may include a build-up film of polymer layers. In one embodiment, the substrate core 152 may include a dielectric material selected from a silicon, silicon nitride, a ceramic material, or a glass material. In one embodiment, the semiconductor package 100 may further include a lower reinforcement layer 180B embedded in the lower redistribution layer 160B, the lower reinforcement layer 180B having a Young's modulus that is higher than a Young's modulus of the upper redistribution layer 180A. In one embodiment, the upper reinforcement layer 180A may include a dielectric material selected from a silicon, silicon nitride, a ceramic material, or a glass material. In one embodiment, the lower reinforcement layer 180B may have a thickness that is less than or equal to a thickness of the lower redistribution layer 160B. In one embodiment, the thickness of the lower reinforcement layer 180B ranges from 10 μm to 164 μm; and a thickness of the upper reinforcement layer 180A ranges from 10 μm to 164 μm. In one embodiment, the semiconductor package 100 may also include an interposer 108 electrically connecting the upper redistribution layer 160A and the semiconductor device 104, 106; a perimeter of the upper reinforcement layer 180A is disposed outside of a perimeter of the semiconductor device 104, 106; and a perimeter of the lower reinforcement layer 180B is disposed outside of the perimeter of the semiconductor device 104, 106.

According to various embodiments, provided is a semiconductor package 100 may comprise a package substrate 150 comprising: a substrate core 152, an upper redistribution layer 160A disposed on a first side of the substrate core 152; and a lower redistribution layer 160B disposed on an opposing second side of the substrate core 152; a semiconductor device 104 vertically stacked on and electrically connected to the interposer; and a lower reinforcement layer 180B embedded in the lower redistribution layer 160B facing the semiconductor device 104, the upper reinforcement layer 180A having a Young's modulus that is higher than a Young's modulus of the upper redistribution layer 160A In one embodiment, a perimeter of the upper reinforcement layer 180A may be disposed outside of a perimeter of the semiconductor device 104. In one embodiment, the Young's modulus of the upper reinforcement layer 180A ranges from 14 GPa to 100 GPa. In some embodiments, the upper reinforcement layer may have a thickness that is less than or equal to a thickness of the upper redistribution layer. In some embodiments, the thickness of the upper reinforcement layer 180A may range from 10 μm to 164 μm. In various embodiments, the upper reinforcement layer 180A comprises a dielectric material selected from a silicon, silicon nitride, a ceramic material, or a glass material. In various embodiments, the package substrate 150 may also include a lower reinforcement layer 180B embedded in the lower redistribution layer 160B, the lower reinforcement layer 180B having a Young's modulus that is higher than a Young's modulus of the lower redistribution layer 160B. In some embodiments, the semiconductor package 100 comprises an interposer 108 electrically connecting the upper redistribution layer 160A and the semiconductor device 104.

In one embodiment, the semiconductor package may include an interposer 108 electrically connecting the upper redistribution layer 160A and the semiconductor device 104, 106; and a perimeter of the lower reinforcement layer 180B may be disposed outside of the perimeter of the semiconductor device 104, 106. In one embodiment, the lower reinforcement layer 180B may include a dielectric material selected from a silicon, silicon nitride, a ceramic material, or a glass material; and the substrate core 152 may include a dielectric material selected from a silicon, silicon nitride, a ceramic material, or a glass material. In one embodiment, the Young's modulus of the lower reinforcement layer 180B ranges from 14 GPa to 100 GPa; and a thickness of the lower reinforcement layer 180B ranges from 10 μm to 164 μm.

According to various embodiments, provided is a method of manufacturing a semiconductor package 100, comprising: forming package substrate 150 comprising a substrate core 152, an upper redistribution layer 160A disposed on a first side of the substrate core 152, and a lower redistribution layer 160B disposed on an opposing second side of the substrate core 152; etching the upper redistribution layer 160A to form a first trench T1; depositing a reinforcement material 180M on the upper redistribution layer 160A and in the first trench T1; thinning the reinforcement material 180M to form an upper reinforcement layer 180A in the first trench; forming via structures 162V in the upper reinforcement layer 180A; forming upper bonding pads 161 on the via structures 162V; and bonding a semiconductor device 104 to the package substrate 150, such that a perimeter of the semiconductor device 104 is disposed inside of a perimeter of the upper reinforcement layer 180A; wherein the upper reinforcement layer 180A has a Young's modulus that is greater than a Young's modulus of the upper redistribution layer 160A.

In one embodiment, the method may also include: etching a lower redistribution layer 160B to form a second trench; depositing a reinforcement layer material on the lower redistribution layer 180B and in the second trench; etching back the reinforcement layer material to form a lower reinforcement layer 180B in the second trench; forming via structures 162V in the lower reinforcement layer 180B; and forming lower bonding pads 163 on the via structures 162V of the lower reinforcement layer 180B, wherein the lower reinforcement layer 180B has a Young's modulus that is greater than a Young's modulus of the lower redistribution layer 160B.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
   a package substrate comprising:
      a substrate core;

an upper redistribution layer disposed on a first side of the substrate core and comprising a dielectric structure and metal features that extend through the dielectric structure; and a lower redistribution layer disposed on an opposing second side of the substrate core;

an interposer vertically stacked on the upper redistribution layer and connected to the metal features;

a semiconductor device vertically stacked on and connected to the interposer; and an upper reinforcement layer embedded in the upper redistribution layer between the semiconductor device and the substrate core, the upper reinforcement layer having a Young's modulus that is higher than a Young's modulus of the upper redistribution layer, wherein the metal features extend through the upper reinforcement layer.

2. The semiconductor device of claim 1, wherein a horizontal perimeter of the upper reinforcement layer is disposed outside of a perimeter of the semiconductor device.

3. The semiconductor device of claim 1, wherein the Young's modulus of the upper reinforcement layer ranges from 14 GPa to 100 GPa.

4. The semiconductor device of claim 1, wherein the upper reinforcement layer has a thickness that is less than or equal to a thickness of the upper redistribution layer.

5. The semiconductor device of claim 4, wherein the thickness of the upper reinforcement layer ranges from 10 μm to 164 μm.

6. The semiconductor device of claim 1, wherein the upper reinforcement layer comprises a dielectric material selected from a silicon, silicon nitride, a ceramic material, or a glass material.

7. The semiconductor device of claim 6, wherein the metal features comprise bonding pads formed on an upper surface of the reinforcement layer.

8. The semiconductor device of claim 7, wherein the dielectric structure comprises a build-up film of polymer layers.

9. The semiconductor device of claim 6, wherein the substrate core comprises a dielectric material selected from a silicon, silicon nitride, a ceramic material, or a glass material.

10. The semiconductor device of claim 1, further comprising a lower reinforcement layer embedded in the lower redistribution layer, the lower reinforcement layer having a Young's modulus that is higher than a Young's modulus of the upper redistribution layer.

11. The semiconductor device of claim 10, wherein the upper reinforcement layer comprises a dielectric material selected from a silicon, silicon nitride, a ceramic material, or a glass material.

12. The semiconductor device of claim 10, wherein the lower reinforcement layer has a thickness that is less than or equal to a thickness of the lower redistribution layer.

13. The semiconductor device of claim 12, wherein:
the thickness of the lower reinforcement layer ranges from 10 μm to 164 μm; and
a thickness of the upper reinforcement layer ranges from 10 μm to 164 μm.

14. The semiconductor device of claim 10, wherein:
a horizontal perimeter of the upper reinforcement layer is disposed outside of a perimeter of the semiconductor device; and
a horizontal perimeter of the lower reinforcement layer is disposed outside of the perimeter of the semiconductor device.

15. A semiconductor package comprising:
a package substrate comprising:
a substrate core;
an upper redistribution layer disposed on a first side of the substrate core; and
a lower redistribution layer disposed on an opposing second side of the substrate core and comprising a dielectric structure and metal features that extend through the dielectric structure;
an interposer vertically stacked on and connected to the upper redistribution layer;
a semiconductor device vertically stacked on and connected to the interposer; and
a lower reinforcement layer embedded in the lower redistribution layer facing the semiconductor device, the lower reinforcement layer having a Young's modulus that is higher than a Young's modulus of the lower redistribution layer, wherein the metal features extend through the lower reinforcement layer.

16. The semiconductor device of claim 15, wherein a horizontal perimeter of the lower reinforcement layer is disposed outside of the perimeter of the semiconductor device.

17. The semiconductor device of claim 15, wherein:
the lower reinforcement layer comprises a dielectric material selected from a silicon, silicon nitride, a ceramic material, or a glass material; and
the substrate core comprises a dielectric material selected from a silicon, silicon nitride, a ceramic material, or a glass material.

18. The semiconductor device of claim 15, wherein:
the Young's modulus of the lower reinforcement layer ranges from 14 GPa to 100 GPa; and
a thickness of the lower reinforcement layer ranges from 10 μm to 164 μm.

19. A method of manufacturing a semiconductor package, comprising:
forming package substrate comprising a substrate core, an upper redistribution layer disposed on a first side of the substrate core, and a lower redistribution layer disposed on an opposing second side of the substrate core;
etching the upper redistribution layer to form a first trench;
depositing a reinforcement layer material on the upper redistribution layer and in the first trench;
thinning the reinforcement layer material to form an upper reinforcement layer in the first trench;
forming via structures in the upper reinforcement layer;
forming upper bonding pads on the via structures; and
bonding a semiconductor device to the package substrate, such that a perimeter of the semiconductor device is disposed inside of a perimeter of the first reinforcement layer,
wherein the upper reinforcement layer has a Young's modulus that is greater than a Young's modulus of the upper redistribution layer.

20. The method of claim 19, further comprising:
etching the lower redistribution layer to form a second trench;
depositing a reinforcement layer material on the lower redistribution layer and in the second trench;
etching back the reinforcement layer material to form a lower reinforcement layer in the second trench;
forming via structures in the lower reinforcement layer; and
forming lower bonding pads on the via structures of the lower reinforcement layer, wherein the lower reinforcement layer has a Young's modulus that is greater than a Young's modulus of the lower redistribution layer.

* * * * *